US011117804B2

(12) United States Patent
Cho et al.

(10) Patent No.: US 11,117,804 B2
(45) Date of Patent: Sep. 14, 2021

(54) METHOD OF SYNTHESIZING THICKNESS-CONTROLLED GRAPHENE THROUGH CHEMICAL VAPOR DEPOSITION USING CU—NI THIN FILM LAMINATE

(71) Applicant: CENTER FOR ADVANCED SOFT ELECTRONICS, Pohang-si (KR)

(72) Inventors: Kilwon Cho, Pohang-si (KR); Min Seok Yoo, Pohang-si (KR); Hyo Chan Lee, Seoul (KR)

(73) Assignees: CENTER FOR ADVANCED SOFT ELECTRONICS, Pohang-si (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 226 days.

(21) Appl. No.: 15/867,913

(22) Filed: Jan. 11, 2018

(65) Prior Publication Data

US 2018/0346338 A1    Dec. 6, 2018

(30) Foreign Application Priority Data

Jun. 2, 2017    (KR) .......................... 10-2017-0069244

(51) Int. Cl.
*C01B 32/182*    (2017.01)
*C01B 32/186*    (2017.01)
(Continued)

(52) U.S. Cl.
CPC ........ *C01B 32/186* (2017.08); *C23C 14/3442* (2013.01); *C23C 16/0281* (2013.01);
(Continued)

(58) Field of Classification Search
None
See application file for complete search history.

(56) References Cited

U.S. PATENT DOCUMENTS

2011/0108609 A1*  5/2011  Woo .................. B82Y 30/00
                                                  228/176
2011/0269299 A1*  11/2011  Zhang ................. B82Y 30/00
                                                  438/478

(Continued)

FOREIGN PATENT DOCUMENTS

CN       104681801    *  6/2015   ............. H01M 4/38
KR    1020110051584 A     5/2011

OTHER PUBLICATIONS

Liu et al. "Controllable and rapid synthesis of high quality and large area bernal stacked bilayer graphene using CVD" (from IDS) (Year: 2013).*

(Continued)

*Primary Examiner* — Mandy C Louie
(74) *Attorney, Agent, or Firm* — STIP Law Group, LLC

(57)    ABSTRACT

Disclosed is a method of synthesizing graphene, wherein a Cu—Ni thin film laminate including a copper thin film and a nickel thin film formed thereon is placed in a chemical vapor depositor, brought into contact with a graphene precursor and subjected to chemical vapor deposition (CVD), thus synthesizing thickness-controlled graphene on the copper thin film, whereby the thickness of multilayer graphene can be easily and reproducibly controlled by adjusting only nickel thickness and CVD time, and a process window for obtaining reproducible results can be widened due to self-limiting properties whereby the maximum thickness of graphene is obtained after a certain synthesis time due to the thickness-controlled nickel thin film. Also, carbon atoms absorbed to the nickel thin film reach the copper thin film opposite thereto through internal diffusion of the metal laminate to thus grow graphene via surface-mediated reaction thereon, thereby improving the uniformity of synthesized graphene.

11 Claims, 13 Drawing Sheets

(51) Int. Cl.
*C23C 14/34* (2006.01)
*C23C 16/26* (2006.01)
*C23C 16/04* (2006.01)
*C23C 16/02* (2006.01)

(52) U.S. Cl.
CPC .............. *C23C 16/04* (2013.01); *C23C 16/26* (2013.01); *C01B 2204/04* (2013.01)

(56) References Cited

U.S. PATENT DOCUMENTS

| | | | | |
|---|---|---|---|---|
| 2013/0187097 A1* | 7/2013 | Hong | ...................... | C23C 16/26 252/510 |
| 2013/0214252 A1* | 8/2013 | Park | ...................... | B82Y 30/00 257/29 |
| 2015/0017344 A1* | 1/2015 | Dong | ...................... | B82Y 40/00 427/534 |
| 2015/0191358 A1* | 7/2015 | Choi | ...................... | C01B 32/186 428/201 |
| 2016/0297682 A1* | 10/2016 | Anderson | ............. | H01L 21/042 |
| 2017/0130360 A1* | 5/2017 | Wu | ......................... | C23C 16/26 |

OTHER PUBLICATIONS

Choi, Hyonkwang et al. "Precise control of chemical vapor deposition graphene layer thickness using NixCu1-x alloys" 2015, J. Mater. Chem. C, 3, p. 1463. (Year: 2015).*

Wei Liu et al., Controllable and Rapid Synthesis of High-Quality and Large-Area Bernal Stacked Bilayer Graphene Using Chemical Vapor Deposition, Chemistry of materials, Dec. 5, 2013, vol. 26, pp. 907-915, America Chemical Society, Washington DC, USA.

Office Action from Korean intellectual Property Office of 10-2017-0069244, dated Nov. 8, 2018.

* cited by examiner

[FIG. 1A]
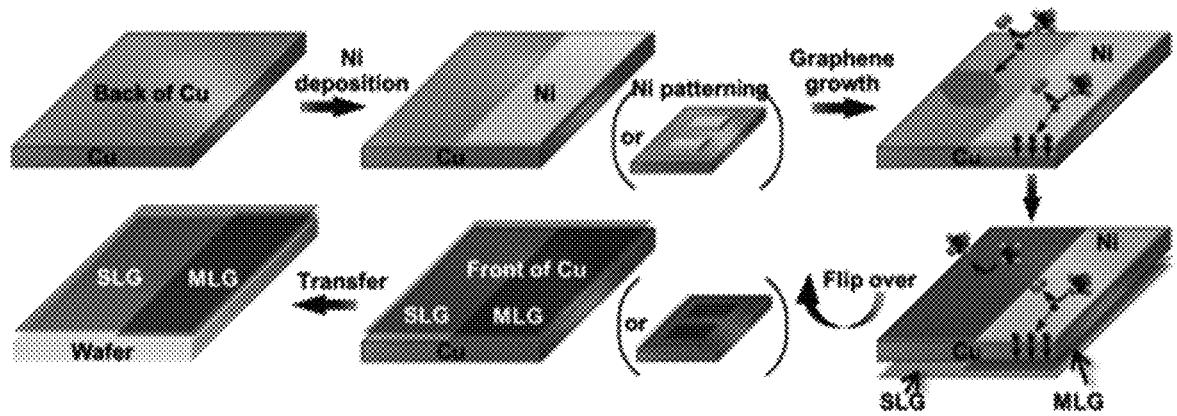
[FIG. 1B]
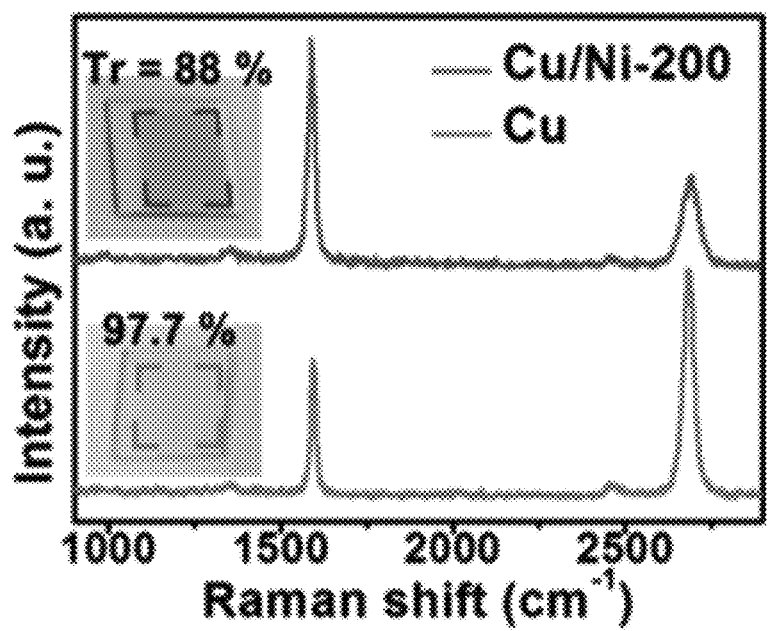

[FIG. 1C]
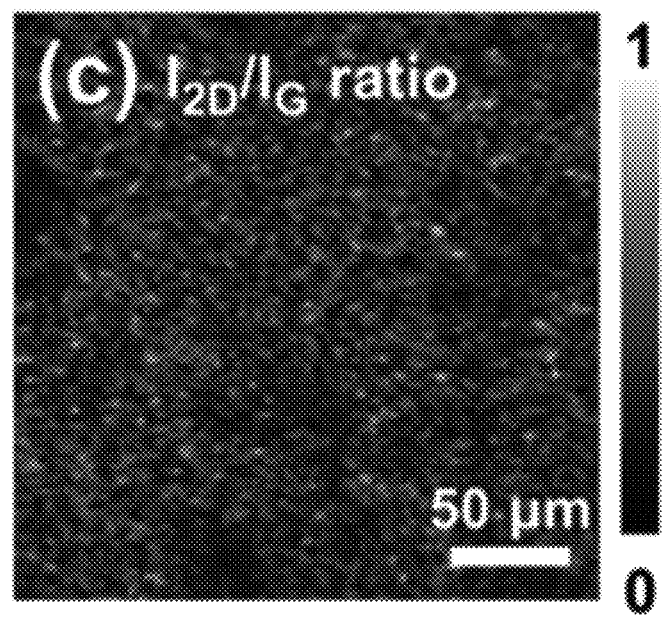
[FIG. 1D]
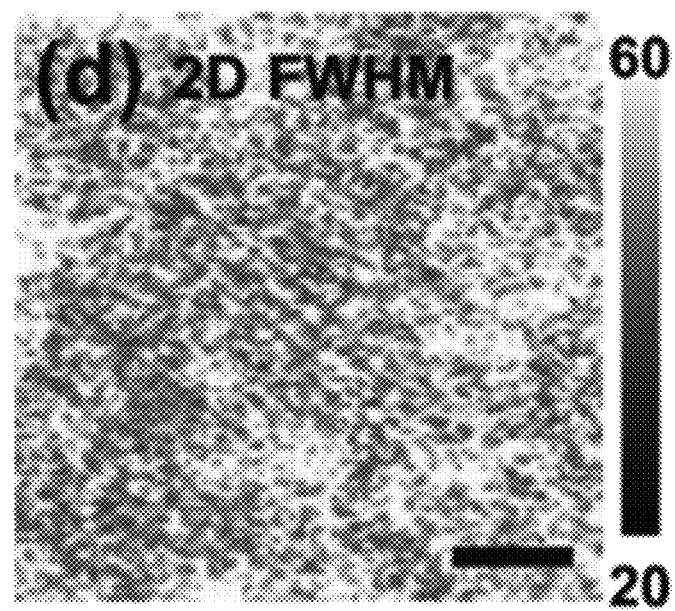

[FIG. 1E]
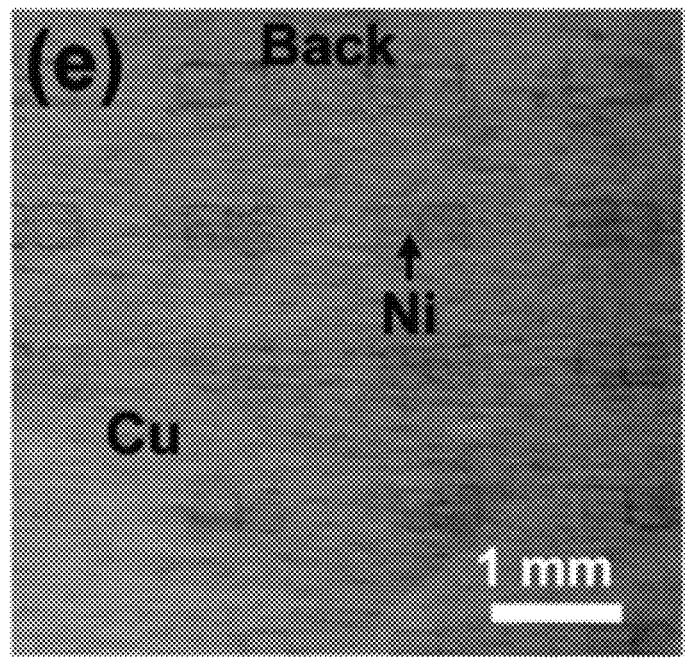
[FIG. 1F]
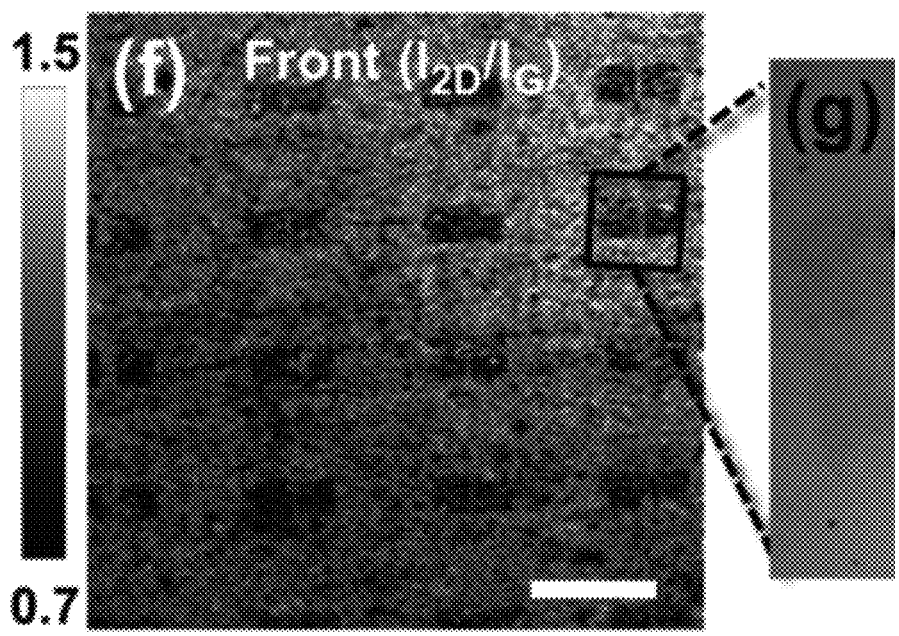

[FIG. 1G]
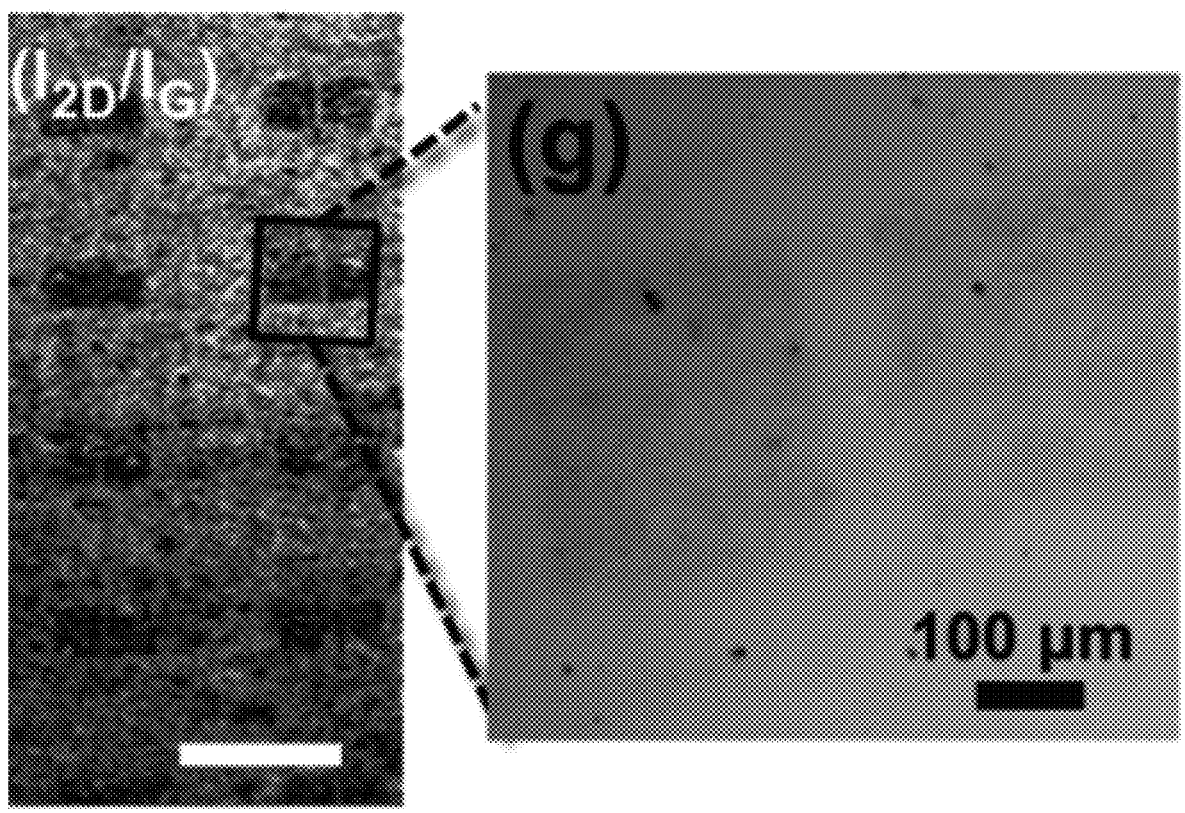

[FIG. 2A]
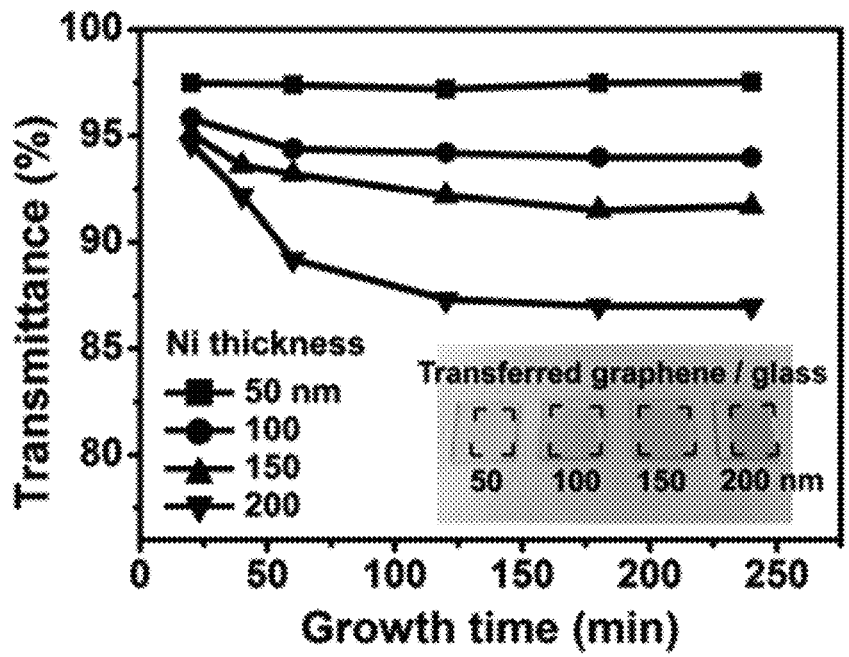
[FIG. 2B]
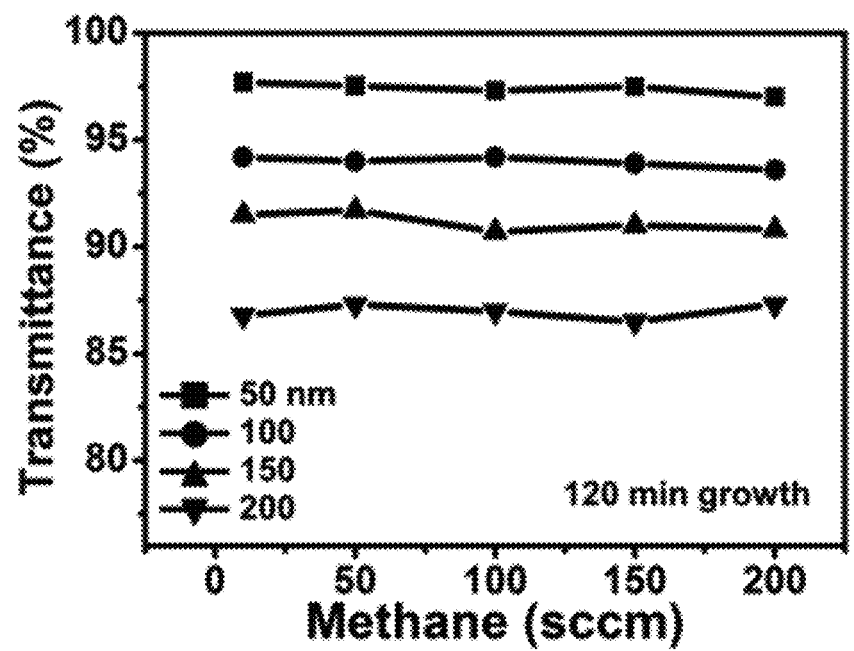

[FIG. 3A]
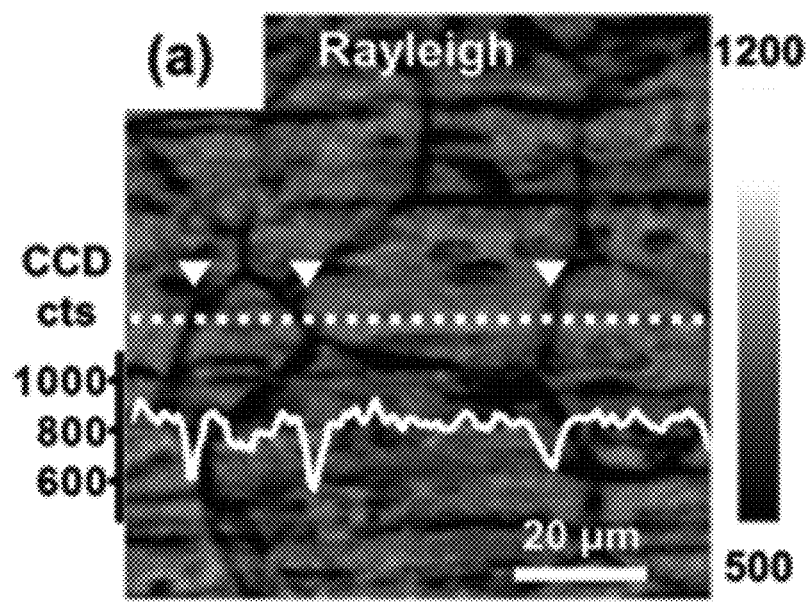
[FIG. 3B]
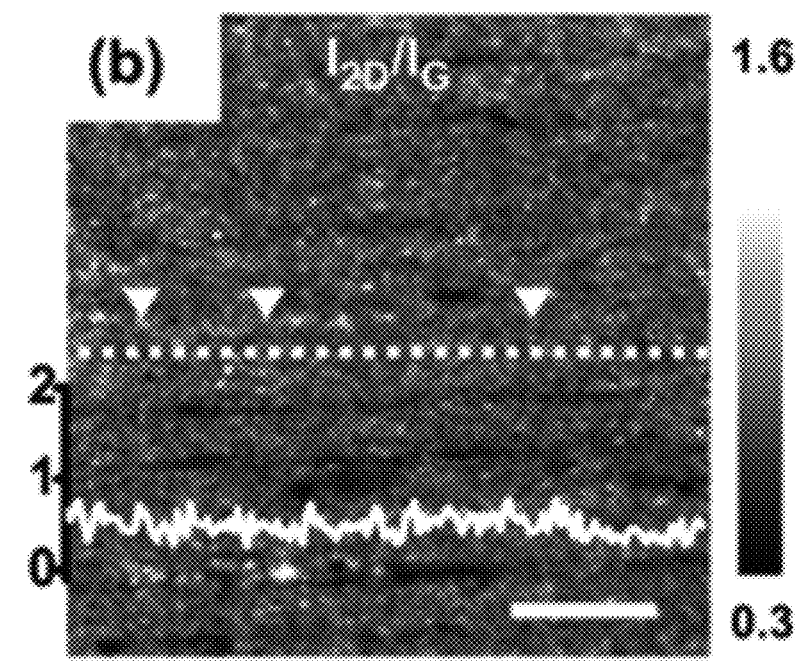

[FIG. 3C]
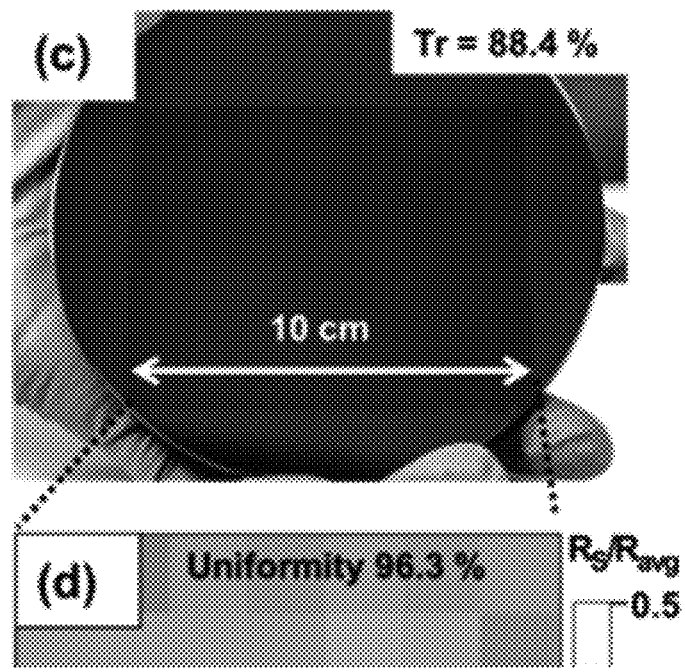
[FIG. 3D]
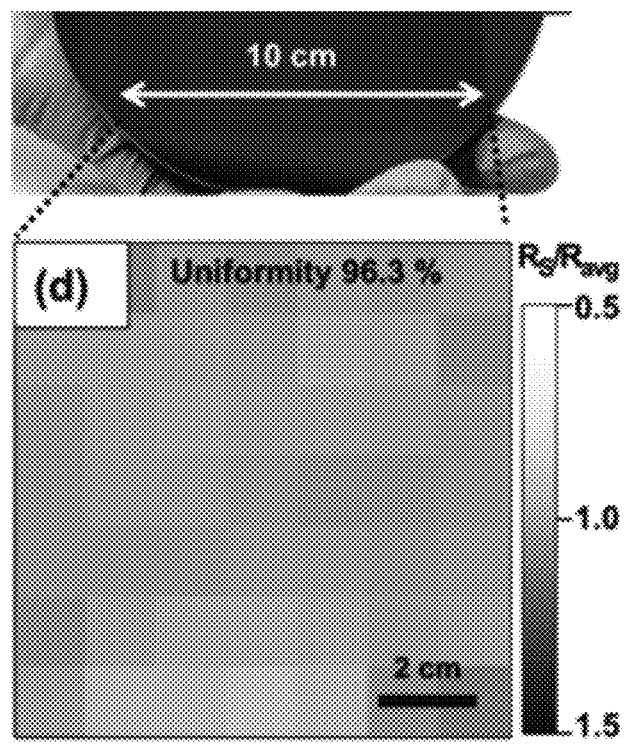

[FIG. 4]
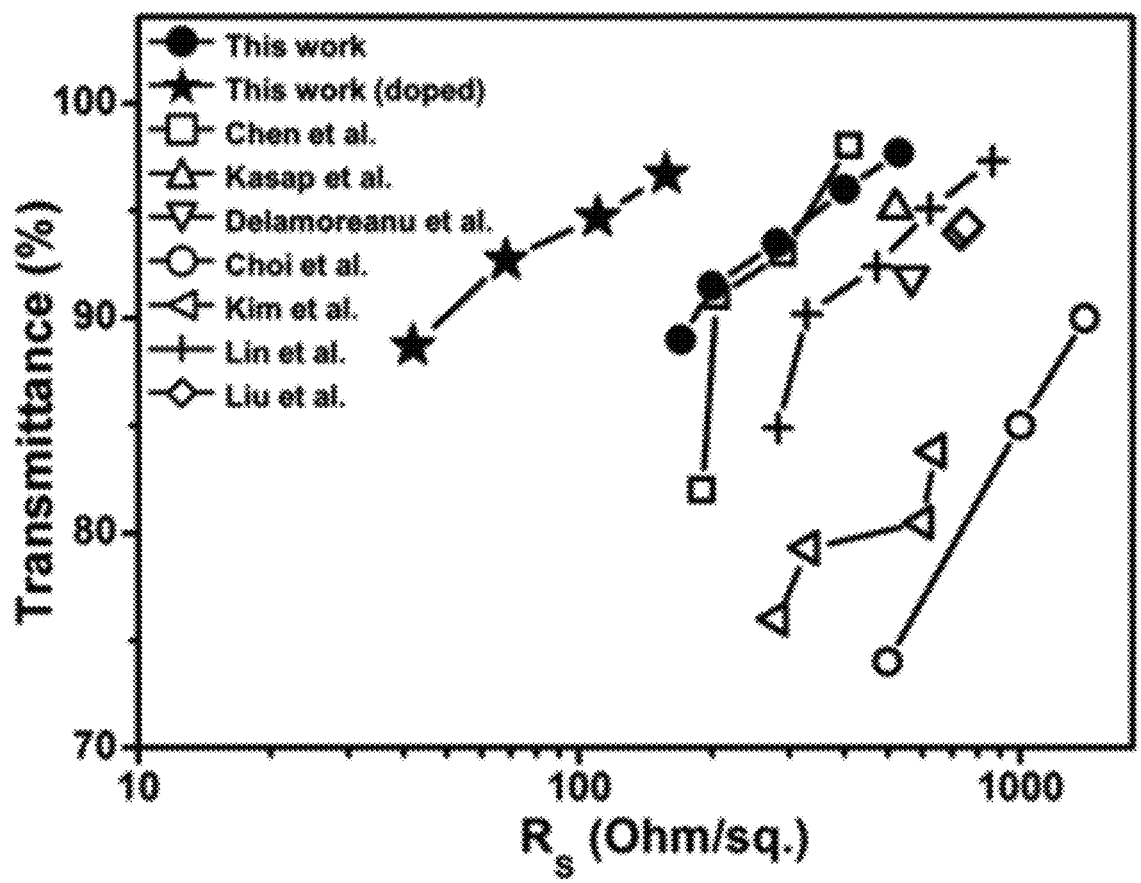

[FIG. 5A]
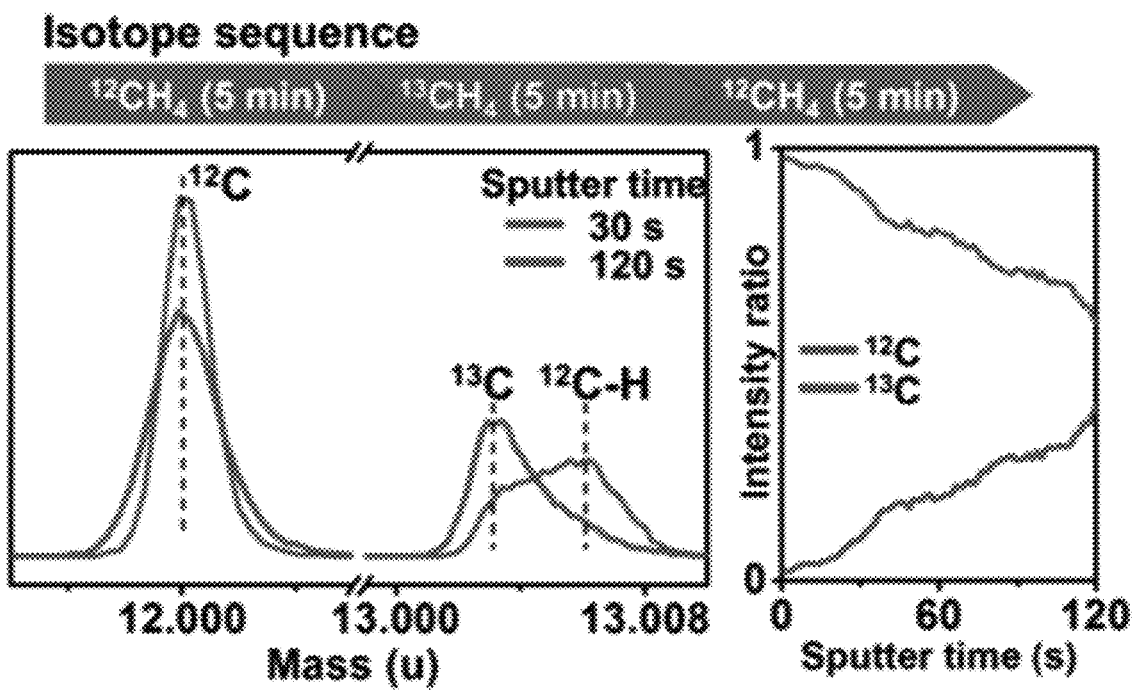
[FIG. 5B]
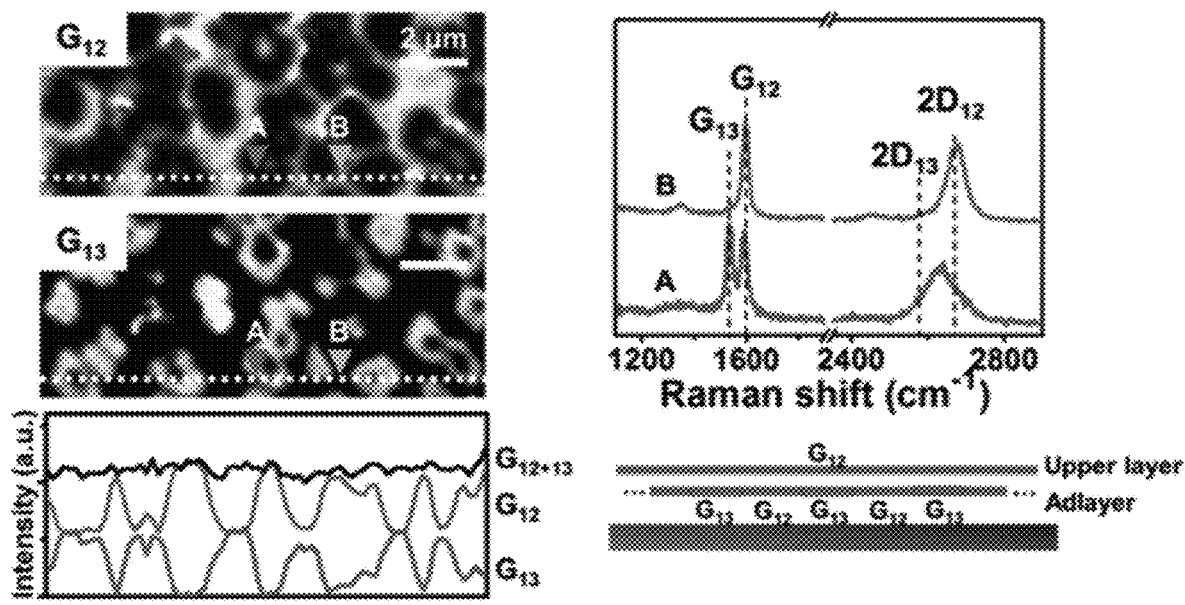

[FIG. 5C]
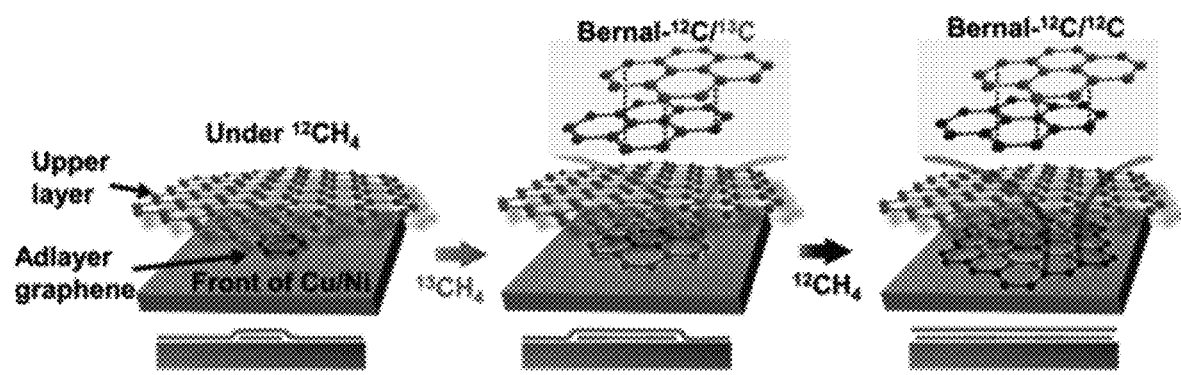
[FIG. 5D]
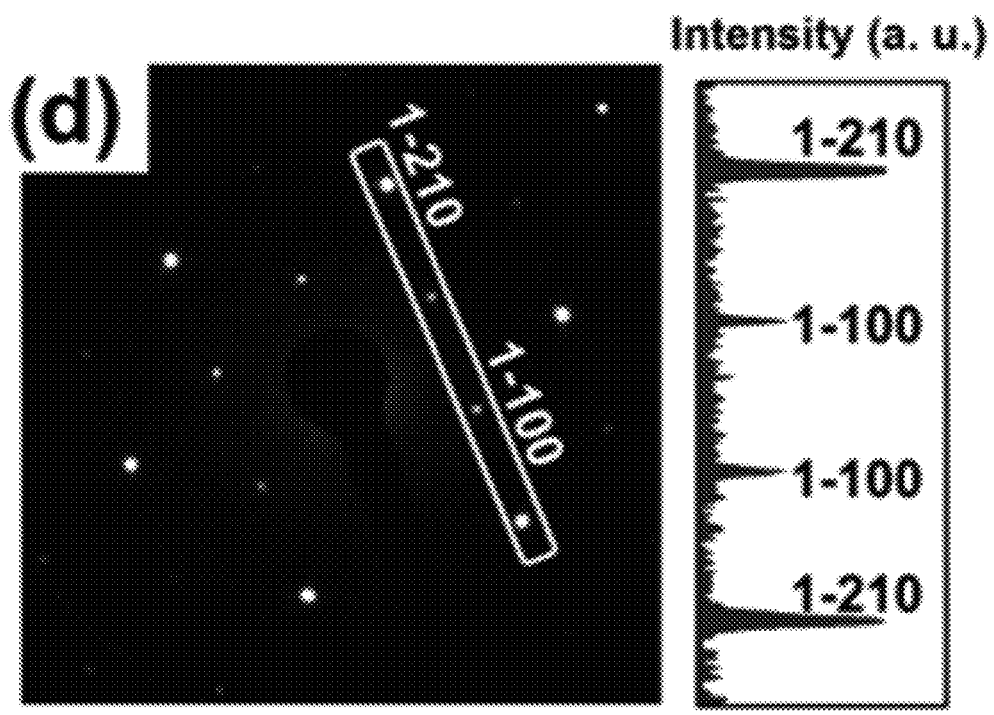

[FIG. 6A]
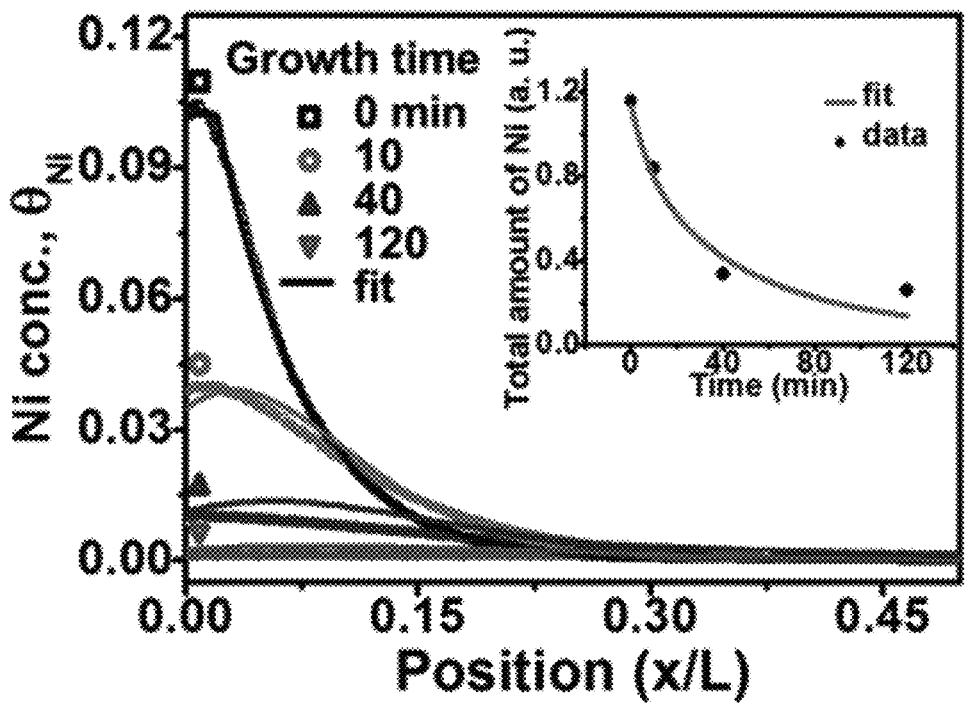
[FIG. 6B]
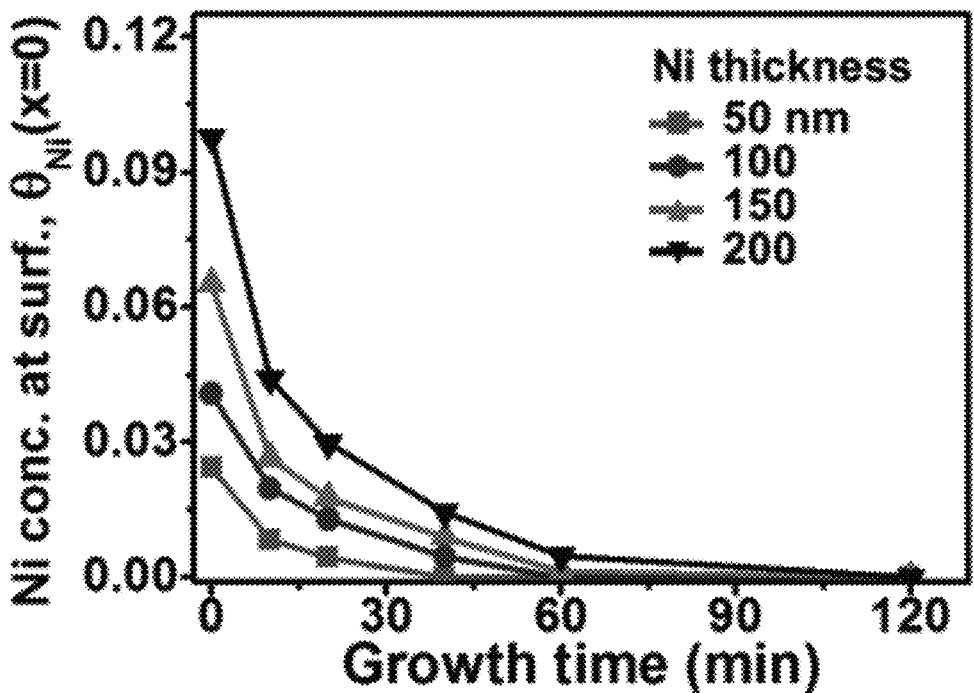

[FIG. 6C]
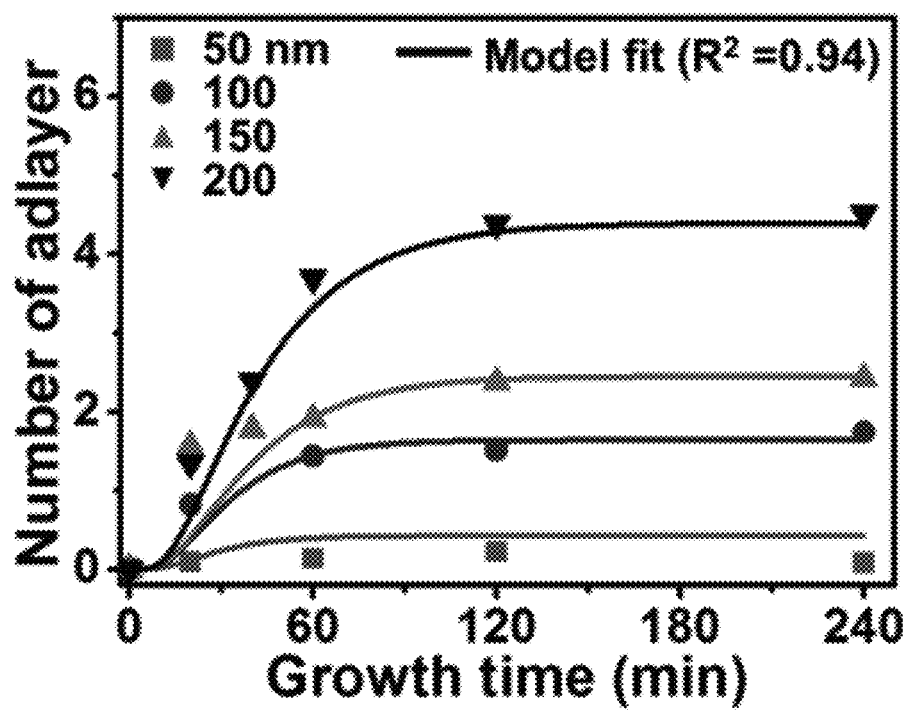
[FIG. 6D]
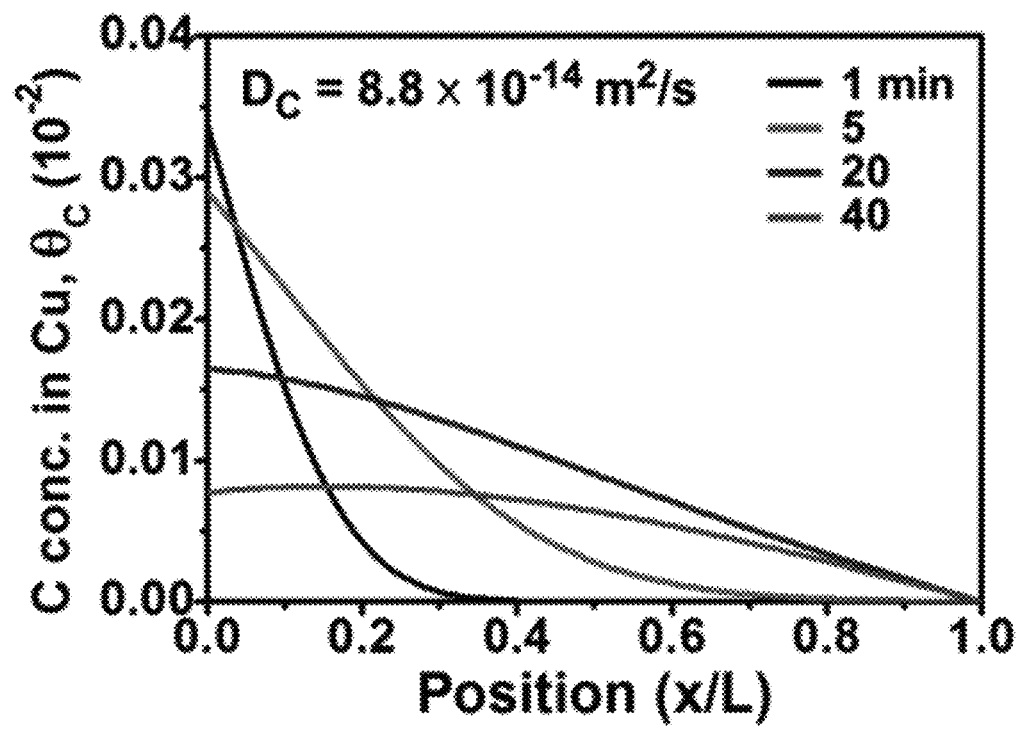

[FIG. 7]
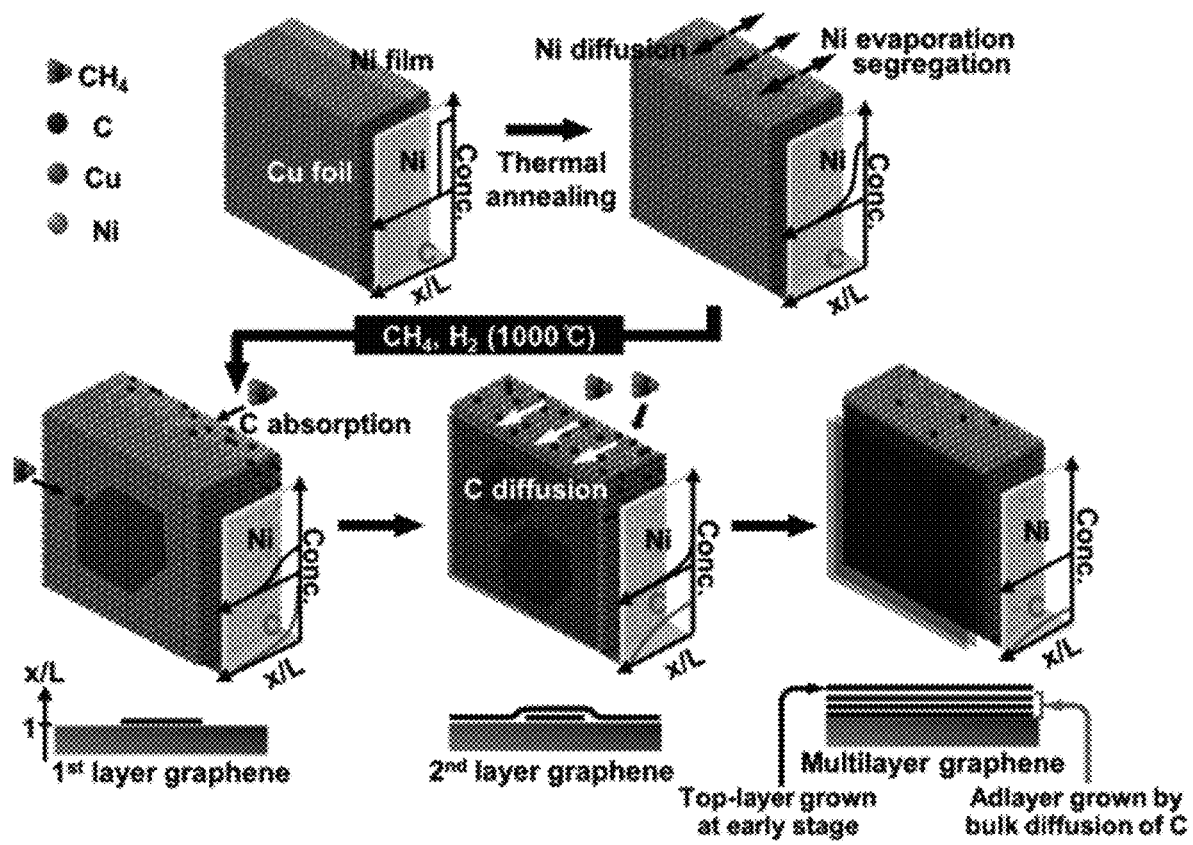

METHOD OF SYNTHESIZING THICKNESS-CONTROLLED GRAPHENE THROUGH CHEMICAL VAPOR DEPOSITION USING CU—NI THIN FILM LAMINATE

CROSS-REFERENCE TO RELATED APPLICATION

This application claims the priority of the Korean Patent Application NO 10-2017-0069244 filed on Jun. 2, 2017, in the Korean Intellectual. Property Office, disclosure of is incorporated herein by reference.

BACKGROUND OF THE INVENTION

1. Technical Field

The present invention relates to a method of synthesizing graphene, and more particularly to a method of synthesizing thickness-controlled graphene by bringing a graphene precursor into contact with a Cu—Ni thin film laminate including a copper thin film and a nickel thin film formed on the copper thin film, followed by chemical vapor deposition (CVD), and to patterned graphene using the same.

2. Description of the Related Art

The electrical structure of multilayer graphene is determined by the stacking structure of graphene and the number of layers thereof. Thus, the properties of multilayer graphene, such as charge mobility, transmittance, and sheet resistance, are controlled by varying the stacking structure and the thickness of graphene. Particularly, in Bernal-stacked multilayer graphene, in which a graphene carbon array is stacked to be shifted by one carbon-carbon bond length with a graphene carbon array adjacent thereto, the bandgap is controlled by an external electric field. Thus, in order to apply graphene to optoelectronic devices, the large-area synthesis of high-quality Bernal-stacked graphene, the number of layers of which is controlled, is regarded as important.

Conventionally, multilayer graphene is synthesized through chemical vapor deposition using a metal having high carbon solubility, such as nickel or a copper-nickel alloy. The carbon atoms dissolved in metal at a high temperature diffuse to the surface of the metal during cooling and are thus precipitated, thereby forming multilayer graphene on the surface of the metal. However, this method is problematic because the rate of precipitation of carbon is not constant, thus decreasing the uniformity of multilayer graphene, and also because it is difficult to reproducibly control the number of layers of graphene due to various process parameters, such as a metal supply rate, a cooling rate, elements of catalyst metal, etc.

Unlike the nickel or copper-nickel alloy, copper has low carbon solubility, making it possible to synthesize high-quality graphene having low defect density through surface-mediated reaction of copper and carbon atoms. Recently, the synthesis of uniform Bernal-stacked multilayer graphene through a surface reaction using a copper pocket has been reported. For the outer surface of the copper pocket, the copper surface is passivated by the rapidly formed graphene and thus the growth of graphene is terminated, and for the inner surface of the copper pocket, the rate of growth of graphene is low compared to the outer surface thereof, and thus the generation of carbon atoms due to the decomposition of methane through the exposed copper surface lasts for a longer time. Because of the asymmetrical growth environment, the concentration gradient of carbon atoms, which is high on the inner surface of the copper pocket and is low on the outer surface of the copper pocket in the thickness direction thereof, is formed, and the carbon atoms produced inside the copper pocket are diffused to the outer surface of the copper pocket, thus yielding uniform Bernal-stacked multilayer graphene. However, this method is disadvantageous in that it is difficult to adjust the asymmetrical growth environment of both surfaces of the copper pocket, the number of layers of graphene to be synthesized is limited to 3 or less, and large-area synthesis is difficult.

SUMMARY OF THE INVENTION

Accordingly, the present invention has been made keeping in mind the problems encountered in the related art, and the present invention is intended to provide uniform Bernal-stacked multilayer graphene using a Cu—Ni thin film laminate including a copper thin film and a nickel thin film formed on the copper thin film, and a method of synthesizing the same.

In addition, the present invention is intended to provide a method of synthesizing large-area graphene, in which only the thickness of the stacked nickel thin film and the chemical vapor deposition time are adjusted, thus controlling the thickness of graphene, whereby high reproducibility of large-area graphene may be realized by simple process parameters and the number of layers thereof may be controlled.

In addition, the present invention is intended to provide patterned graphene, in which graphene layers having different thicknesses are continuously connected, through a simple process.

Therefore, an aspect of the present invention provides a method of synthesizing graphene, comprising: (a) placing a Cu—Ni thin film laminate including a copper thin film and a nickel thin film formed on the copper thin film in a chemical vapor depositor; and (b) bringing a graphene precursor into contact with the Cu—Ni thin film laminate and performing chemical vapor deposition (CVD), thus synthesizing graphene on the copper thin film.

The thickness or the number of layers of graphene synthesized on the copper thin film may be controlled by adjusting the thickness of the nickel thin film and/or the chemical vapor deposition time.

The nickel thin film may have a thickness ranging from 5 to 1,000 nm.

The number of layers of graphene may be any one ranging from 1 to 10.

The thickness of the nickel thin film may be adjusted to the range of 10 to 70 nm in step (a), whereby single-layer graphene may be synthesized in step (b).

The thickness of the nickel thin film may be adjusted to the range of 1000 nm or less but exceeding 70 nm in step (a), whereby multilayer graphene may be synthesized in step (b).

The multilayer graphene may be Bernal-stacked multilayer graphene.

The nickel thin film may be diffused to the copper thin film during the chemical vapor deposition to thus realize a concentration distribution of nickel in the copper thin film.

The graphene precursor may be a hydrocarbon compound.

The hydrocarbon compound may be at least one selected from the group consisting of methane, ethane, propane, butane, ethylene, propylene, butylene, benzene, and ethanol.

The chemical vapor deposition may be performed at a temperature of 600 to 1,300° C., preferably 700 to 1300° C., and more preferably 850 to 1050° C.

The chemical vapor deposition may be performed by supplying the graphene precursor at a rate of 0.1 to 500 sccm, and preferably 10 to 500 sccm.

The chemical vapor deposition may be performed for 10 to 500 min.

The chemical vapor deposition may be performed using any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

The nickel thin film in step (a) may be a nickel thin film having a pattern.

The pattern may include at least one shape selected from the group consisting of a circular shape, an oval shape, a polygonal shape, a wave shape, a zigzag shape, and a convexo-concave shape.

Another aspect of the present invention provides patterned graphene, comprising: a first graphene part including m graphene layers; and a second graphene part, connected side by side to the first graphene part through covalent bonding, patterned, and configured to include m+n graphene layers, wherein m is any one integer of 1 to 5, and n is any one integer of 1 to 5.

According to the present invention, uniform Bernal-stacked multilayer graphene can be provided using a Cu—Ni thin film laminate including a copper thin film and a nickel thin film formed on the copper thin film.

Also, according to the present invention, a method of synthesizing large-area graphene can be provided, in which only the thickness of the stacked nickel thin film and the chemical vapor deposition time are adjusted, thus controlling the thickness of graphene, whereby high reproducibility of large-area graphene can be realized by simple process parameters and the number of layers thereof can be controlled.

Also, according to the present invention, patterned graphene, in which graphene layers having different thicknesses are continuously connected, can be provided through a simple process.

BRIEF DESCRIPTION OF DRAWINGS

FIG. 1A stepwisely shows a process of growing graphene in Example 32, FIG. 1B shows the average Raman spectrum of graphene synthesized in Example 32 and Comparative Example 1, FIGS. 1C and 1D respectively show the Raman $I_{2D}/I_G$ ratio map and the 2D FWHM map of graphene synthesized in Example 32, FIG. 1E is an image showing the copper thin film of Example 39 patterned and deposited with the nickel thin film, FIG. 1F shows the Raman $I_{2D}/I_G$ ratio map of graphene synthesized in Example 39, and FIG. 1G is a microscope image showing graphene synthesized in Example 39;

FIG. 2A is a graph showing the transmittance of graphene synthesized in Examples 1 to 5, 10 to 14, 19 to 24, and 29 to 34, and FIG. 2B is a graph showing the transmittance of graphene synthesized in Examples 3, 6 to 9, 12, 15 to 18, 22, 25 to 28, 32, and 35 to 38;

FIG. 3A shows the Rayleigh-scattered intensity map of the Cu—Ni thin film laminate of Example 32, FIG. 3B shows the Raman $I_{2D}/I_G$ map of graphene synthesized in the same region as FIG. 3A, FIG. 3C is an image showing graphene of Example 32 transferred onto a silicon dioxide substrate, and FIG. 3D is an image showing the sheet resistance and uniformity of FIG. 3C;

FIG. 4 is a graph showing the sheet resistance versus the transmittance of graphene synthesized in Examples 29 to 33 and graphene synthesized through a one-step process for preparing multilayer graphene on various catalysts;

FIG. 5A is of graphs showing the TOF-SIMS mass spectrum and depth profile in the isotope test of Test Example 5, FIG. 5B shows the Raman intensity map, Raman spectrum, and synthesized multilayer graphene, FIG. 5C shows the process of growing synthesized graphene in the isotope test, and FIG. 5D shows the SAED (Selective-Area Electron Diffraction) pattern and the intensity profile of synthesized graphene;

FIG. 6A shows the SIMS depth profile of nickel atoms present in the Cu—Ni thin film laminate, FIG. 6B is a graph showing the nickel concentration of the Cu—Ni thin film laminate depending on the thickness of the nickel thin film, FIG. 6C is a graph showing the number of layers of synthesized graphene depending on the thickness of the nickel thin film over synthesis time, and FIG. 6D is a graph showing the concentration of carbon atoms depending on the position of the Cu—Ni thin film laminate over the synthesis time; and FIG. 7 shows the mechanism of growth of graphene using the Cu—Ni thin film laminate.

DESCRIPTION OF SPECIFIC EMBODIMENTS

The present invention may be embodied in many different forms, and should not be construed as being limited only to the embodiments set forth herein, but should be understood to cover all modifications, equivalents or alternatives falling within the ideas and technical scope of the present invention. In the description of the present invention, detailed descriptions of related known techniques incorporated herein will be omitted when the same may make the gist of the present invention unclear.

As used herein, the terms "first", "second", etc. may be used to describe various elements, but these elements are not to be limited by these terms. These terms are only used to distinguish one element from another. For example, a first element may be termed a second element, and similarly, a second element may be termed a first element, without departing from the scope of the present invention.

Further, it will be understood that when an element is referred to as being "formed" or "layered" on another element, it can be formed or layered so as to be directly attached to the entire surface or one surface of the other element, or intervening elements may be present therebetween.

Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

The present invention pertains to a novel method of synthesizing thickness-controlled graphene, in which a new type of Cu—Ni thin film laminate is prepared in different graphene growth environments, after which chemical vapor deposition is then performed, and to patterned graphene using the same.

FIG. 1A stepwisely shows the process of growing graphene according to the present invention.

Below is a description of the method of synthesizing graphene according to the present invention, made with reference to FIG. 1A.

Specifically, a Cu—Ni thin film laminate, including a copper thin film and a nickel thin film formed on the copper thin film, is placed in a chemical vapor depositor (step a).

The thickness of the nickel thin film is 5 to 1,000 nm, and preferably 50 to 300 nm.

The nickel thin film may be a nickel thin film having a pattern, and the pattern may include at least one shape selected from the group consisting of a circular shape, an oval shape, a polygonal shape, a wave shape, a zigzag shape, and a convexo-concave shape.

Next, a graphene precursor is brought into contact with the Cu—Ni thin film laminate, followed by chemical vapor deposition (CVD), thus synthesizing graphene on the copper thin film (step b).

By adjusting the thickness of the nickel thin film and/or the chemical vapor deposition time, the thickness or the number of layers of graphene synthesized on the copper thin film may be controlled.

Here, the number of layers of graphene may be any one of 1 to 10.

The thickness of the nickel thin film is adjusted to the range of 10 to 70 nm in step (a), whereby single-layer graphene may be synthesized in step (b).

The thickness of the nickel thin film is adjusted to the range of 1000 nm or less but exceeding 70 nm in step (a), whereby multilayer graphene may be synthesized in step (b). Here, the multilayer graphene may be Bernal-stacked multilayer graphene.

During the chemical vapor deposition, the nickel thin film is diffused to the copper thin film, thus forming the concentration distribution of nickel in the copper thin film.

The graphene precursor is a hydrocarbon compound, the hydrocarbon compound being at least one selected from the group consisting of methane, ethane, propane, butane, ethylene, propylene, butylene, benzene, and ethanol. Preferably used is methane.

The chemical vapor deposition may be performed at a temperature of 600 to 1,300° C., preferably 700 to 1,300° C., and more preferably 850 to 1050° C.

The chemical vapor deposition may be conducted by supplying the graphene precursor at a rate of 0.1 to 500 sccm, and preferably 10 to 500 sccm.

The chemical vapor deposition may be carried out for 10 to 500 min, and preferably 20 to 240 min.

The chemical vapor deposition may be performed using any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

In addition, the present invention addresses patterned graphene, comprising: a first graphene part including m graphene layers; a second graphene part, connected side by side to the first graphene part through covalent bonding, patterned, and configured to include m+n graphene layers, wherein m is any one integer of 1 to 5, preferably any one integer of 1 to 3, more preferably an integer of 1 or 2, and most preferably 1, and n is any one integer of 1 to 5, preferably any one integer of 1 to 3, more preferably an integer of 1 or 2, and most preferably 1.

With reference to FIG. 7, the mechanism of growth of graphene using the Cu—Ni thin film laminate according to the present invention is described below.

Specifically, in the copper thin film having low carbon solubility, the carbon atoms are subjected to surface-mediated reaction to form top-layer graphene of Bernal-stacked multilayer graphene. The nickel thin film having high carbon solubility absorbs the carbon atoms generated by the decomposition of methane, whereby the concentration gradient of carbon atoms is formed in the thickness direction of the Cu—Ni thin film laminate and the carbon atoms absorbed to the nickel thin film are diffused to the copper thin film. The diffused carbon atoms function to grow adlayer graphene through surface-mediated reaction between the top-layer graphene and the surface of the copper thin film.

During the chemical vapor deposition, sublimation of the nickel thin film occurs, and the nickel thin film is diffused toward the copper thin film, thus reducing the thickness of the nickel thin film. When the thickness of the nickel thin film is reduced in this way, the amount of carbon atoms that are absorbed through the nickel surface is decreased, whereby the growth of Bernal-stacked multilayer graphene is stopped.

Below is a description of a 1-parameter mathematical model in order to understand the growth of Bernal-stacked multilayer graphene through carbon diffusion in the Cu—Ni thin film laminate according to the present invention.

Specifically, the carbon atom distribution inside the Cu—Ni thin film laminate over time is represented by Equation 1 below.

$$\frac{\partial \theta_C(x,t)}{\partial t} = D_C \frac{\partial^2 \theta_C}{\partial x^2} \qquad \text{Equation 1}$$

In Equation 1, $\theta_c(x,t)$ is the function of position x and time t and indicates the carbon atom concentration of the Cu—Ni thin film laminate, "x=0" indicates the surface of the Cu—Ni thin film on which the nickel thin film is deposited, and "x=L" indicates the surface thereof on which only the copper thin film is present, opposite the above surface. $D_C$ is the carbon diffusivity in the Cu—Ni thin film laminate and is the parameter of this model.

$$\theta_C(0,t) = \alpha \theta_{Ni}(t) \qquad \text{Equation 2}$$

$$\theta_C(L,t) = 0 = \qquad \text{Equation 3}$$

In Equation 2, $\alpha$ is the carbon solubility of nickel and is 0.0053. The carbon supplied from the nickel thin film is determined only by the carbon solubility of the nickel thin film. Also, graphene growing on the nickel thin film has many defects, and thus facilitates the entry and exit of gas molecules or atoms even when present on the nickel thin film, whereby the nickel thin film is not passivated.

Given $\theta_c(x,t)$, the number of graphene layers that are added to the Bernal-stacked multilayer graphene may be calculated over time.

The carbon atoms supplied from the copper thin film of the Cu—Ni thin film laminate having a face-centered cubic structure may be represented by Equation 4 below.

$$F_C = -D_C \frac{4}{a_{Cu}^3} \left. \frac{\partial \theta_C(x,t)}{\partial x} \right|_{x=L} \qquad \text{Equation 4}$$

In Equation 4, $a_{Cu}$ is the lattice unit of the copper thin film.

In order to determine the rate of synthesis of adlayer graphene, the result of Equation 4 is divided by $n_c$. Here, $n_c$ is the carbon atom density of the Bernal-stacked multilayer graphene.

$$\frac{dN_{adlayer}(t)}{dt} = -\frac{4D_C}{n_c a_{Cu}^3} \left.\frac{\partial \theta_C(x, t)}{\partial x}\right|_{x=L} \quad \text{Equation 5}$$

Equation 5 is subjected to integration with time, thus determining the number of layers of the Bernal-stacked multilayer graphene.

$$N_{adlayer}(t) = \frac{4D_C}{n_c a_{Cu}^3} \int_0^t \left.\frac{\partial \theta_C(x, t)}{\partial x}\right|_{x=L} dt$$

The value thus calculated is fitted to data for graphene growth depending on the real time and the thickness of the nickel thin film, whereby the diffusion coefficient of $D_c = 8.8 \times 10^{-14}$ m$^2$s$^{-1}$ may be obtained, which matches the actual data for graphene growth.

A better understanding of the present invention will be given through the following Examples, which are merely set forth to illustrate the present invention but are not to be construed as limiting the scope thereof.

EXAMPLES

Example 1: Synthesis of Graphene

Thermally deposited on the back surface of a copper thin film having a width of 10 cm, a length of 10 cm, and a height of 25 μm was a nickel thin film having a width of 10 cm, a length of 10 cm, and a thickness of 50 nm. The prepared Cu—Ni thin film laminate was placed in a CVD chamber and heated in the presence of hydrogen. When the temperature of the Cu—Ni thin film laminate reached 1000° C., CH$_4$ was supplied for 20 min at a flow rate of 50 sccm, thereby growing graphene. After the termination of the growth of graphene, the chamber was cooled and the synthesized graphene was transferred onto glass or a silicon dioxide substrate.

Examples 2 to 38: Synthesis of Graphene

The graphene of each of Examples 2 to 38 was synthesized in the same manner as in Example 1, with the exception that the conditions of Examples 2 to 38 were used in lieu of the conditions of Example 1 of Table 1 below.

Example 39: Synthesis of Patterned Graphene

The patterned graphene of Example 39 was synthesized in the same manner as in Example 1, with the exception that the conditions of Example 39 were used in lieu of the conditions of Example 1 of Table 1 below and that a nickel thin film having the pattern shown in FIG. 1E was deposited in lieu of the nickel thin film of Example 1 having a width of 10 cm, a length of 10 cm, and a thickness of 50 nm.

Example 40: Synthesis of FeCl$_3$-Doped Graphene

The FeCl$_3$-doped graphene of Example 40 was synthesized in a manner in which the graphene transferred onto the glass or silicon substrate of Example 30 was placed in a vacuum chamber together with a crucible containing a FeCl$_3$ powder, after which Ar was supplied at a flow rate of 10 sccm, heated at 350° C. for 5 hr, and rapidly cooled.

Example 41: Synthesis of FeCl$_3$-Doped Graphene

The FeCl$_3$-doped graphene of Example 41 was synthesized in the same manner as in Example 40, with the exception that the graphene of Example 31 was used in lieu of the graphene of Example 30.

Example 42: Synthesis of FeCl$_3$-Doped Graphene

The FeCl$_3$-doped graphene of Example 42 was synthesized in the same manner as in Example 40, with the exception that the graphene of Example 32 was used in lieu of the graphene of Example 30.

Example 43: Synthesis of FeCl$_3$-Doped Graphene

The FeCl$_3$-doped graphene of Example 43 was synthesized in the same manner as in Example 40, with the exception that the graphene of Example 33 was used in lieu of the graphene of Example 30.

Comparative Example 1: Synthesis of Graphene

The graphene of Comparative Example 1 was synthesized in the same manner as in Example 1, with the exception that the conditions of Comparative Example 1 were used in lieu of the conditions of Example 1 of Table 1 below.

TABLE 1

| | Cu thin film thickness (μm) | Ni thin film thickness (nm) | CH$_4$ flow rate (sccm) | Synthesis time (min) |
| --- | --- | --- | --- | --- |
| Example 1 | 25 | 50 | 50 | 20 |
| Example 2 | 25 | 50 | 50 | 60 |
| Example 3 | 25 | 50 | 50 | 120 |
| Example 4 | 25 | 50 | 50 | 180 |
| Example 5 | 25 | 50 | 50 | 240 |
| Example 6 | 25 | 50 | 10 | 120 |
| Example 7 | 25 | 50 | 100 | 120 |
| Example 8 | 25 | 50 | 150 | 120 |
| Example 9 | 25 | 50 | 200 | 120 |
| Example 10 | 25 | 100 | 50 | 20 |
| Example 11 | 25 | 100 | 50 | 60 |
| Example 12 | 25 | 100 | 50 | 120 |
| Example 13 | 25 | 100 | 50 | 180 |
| Example 14 | 25 | 100 | 50 | 240 |
| Example 15 | 25 | 100 | 10 | 120 |
| Example 16 | 25 | 100 | 100 | 120 |
| Example 17 | 25 | 100 | 150 | 120 |
| Example 18 | 25 | 100 | 200 | 120 |
| Example 19 | 25 | 150 | 50 | 20 |
| Example 20 | 25 | 150 | 50 | 40 |
| Example 21 | 25 | 150 | 50 | 60 |
| Example 22 | 25 | 150 | 50 | 120 |
| Example 23 | 25 | 150 | 50 | 180 |
| Example 24 | 25 | 150 | 50 | 240 |
| Example 25 | 25 | 150 | 10 | 120 |
| Example 26 | 25 | 150 | 100 | 120 |
| Example 27 | 25 | 150 | 150 | 120 |
| Example 28 | 25 | 150 | 200 | 120 |
| Example 29 | 25 | 200 | 50 | 20 |
| Example 30 | 25 | 200 | 50 | 40 |
| Example 31 | 25 | 200 | 50 | 60 |
| Example 32 | 25 | 200 | 50 | 120 |
| Example 33 | 25 | 200 | 50 | 180 |
| Example 34 | 25 | 200 | 50 | 240 |
| Example 35 | 25 | 200 | 10 | 120 |
| Example 36 | 25 | 200 | 100 | 120 |

TABLE 1-continued

|  | Cu thin film thickness (μm) | Ni thin film thickness (nm) | CH$_4$ flow rate (sccm) | Synthesis time (min) |
|---|---|---|---|---|
| Example 37 | 25 | 200 | 150 | 120 |
| Example 38 | 25 | 200 | 200 | 120 |
| Example 39 | 25 | 200 (pattern) | 50 | 120 |
| Comparative Example 1 | 25 | 0 | 50 | 120 |

Test Examples

Test Example 1: Raman Spectrum

In order to analyze the graphene of Example 32 and Comparative Example 1, the transmittance and large-area Raman scan (300 μm×300 μm) thereof were measured.

With reference to FIG. 1B, the transmittance and average Raman spectrum of graphene of Comparative Example 1 show the properties of single-layer graphene having low defect density.

On the other hand, with reference to FIGS. 1B and 1C, the average Raman spectrum of graphene of Example 32 showed an $I_{2D}/I_G$ ratio decreased to 0.304 and a transmittance of 88%. In the large-area Raman scan, two graphenes exhibited uniform Raman spectrum results. Accordingly, the large-area synthesis of multilayer graphene having low defect density was found to be possible.

With reference to FIG. 1D, the FWHM (Full With at Half Maximum) of 2D peak of graphene of Example 32 was an average of 60 cm$^{-1}$, and exceeded 40 cm$^{-1}$ over almost the entire area thereof (~98%). Thereby, the synthesized multilayer graphene can be confirmed to be Bernal-stacked over the large area.

Test Example 2: Analysis of Patterning of Nickel Thin Film

FIG. 1E is an image showing the copper thin film patterned and deposited with the nickel thin film in order to evaluate the effect of nickel on the growth of the multilayer graphene of Example 39.

Based on the results thereof, as shown in FIG. 1F, the multilayer graphene was selectively grown on the Cu—Ni thin film laminate. The multilayer graphene was synthesized only on the copper surface opposite the surface that was deposited with nickel, from which the growth of multilayer graphene was confirmed to be induced by nickel.

Test Example 3: Control of Thickness of Graphene

As shown in FIG. 2A, the thickness of synthesized graphene was increased with an increase in the thickness of the nickel thin film (50, 100, 150, and 200 nm). Also, when the synthesis time was increased, the thickness of the graphene was increased, and the graphene thickness was saturated after a predetermined period of time. This tendency was shown in all of the graphenes of Examples 1 to 5, 10 to 14, 19 to 24, and 29 to 34.

As shown in FIG. 2B, the growth of graphene was not affected by the methane supply or by the cooling rate. Conventional synthesis methods were sensitive to processing conditions, thus making it difficult to control the thickness of graphene and decreasing reproducibility. However, in this test, the thickness of graphene could be easily and reproducibly controlled depending on the synthesis time and the thickness of nickel. In particular, the process window was widened because of the self-limiting properties of graphene growth, in which an increase in the thickness of graphene is terminated after a certain synthesis time, unlike conventional processes.

Test Example 4: Measurement of Uniformity of Multilayer Graphene

Based on the Raman Rayleigh-scattered map, the surface morphology of the Cu—Ni thin film laminate was confirmed, and the uniformly of graphene synthesized in Example 32 was evaluated based on the Raman $I_{2D}/I_G$ ratio for the same region.

As shown in FIGS. 3A and 3B, the multilayer graphene was uniformly grown at the grain boundaries regardless of the surface morphology of the Cu—Ni thin film laminate. Thus, the uniformity of graphene was improved compared to conventional systems.

As shown in FIG. 3C, in order to evaluate uniformity on a wafer scale, graphene having an area of 10 cm×10 cm was transferred onto a silicon dioxide substrate and the sheet resistance thereof was measured. The graphene used had a transparency of 88.4% and sheet resistance at 7×7 points was measured.

As shown in FIG. 3D, the measured sheet resistance values were averaged to be 180 Ω/sq, with high uniformity of 96.3%.

Therefore, multilayer graphene having uniform properties over a large area was confirmed to be synthesized through the present system.

Test Example 5: Measurement of Sheet Resistance

FIG. 4 is a graph showing the sheet resistance versus the transmittance of graphene of Examples 29, 30, 31, 32 and 33 leftward sequentially, as represented by black circles, and of graphene synthesized through a one-step process for preparing multilayer graphene on various catalysts, as represented by the remaining shapes other than the black star shapes.

In FIG. 4, respective documents of Chen et al./Kasap et al./Delamoreanu et al./Choi et al./Kim et al./Lin et al./Liu et al. are disclosed in Nano Lett., 2011, 11 (9), pp 3519-3525/Phys. Chem. Chem. Phys., 2015, 17, 23081-23087/Carbon Vol. 66, 2014, Pages 48-56/J. Mater. Chem. C, 2015, 3, 1463/Nature 457, 706-710 (5 Feb. 2009)/Nanoscale, 2013, 5, 5847-5853/Nano Lett., 2011, 11 (1), pp 297-303.

As shown in FIG. 4, the sheet resistance of the multilayer graphene synthesized through the present invention was lower than the sheet resistance values of multilayer graphene synthesized through a one-step process using different metal catalysts.

In FIG. 4, the black stars show the sheet resistance versus the transmittance of graphene of Examples 40, 41, 42 and 43 leftward sequentially.

With reference to FIG. 4, the sheet resistance was further decreased to 50 Ω/sq at 90% transparency through FeCl$_3$ doping, thereby obtaining graphene that satisfies the electrical conductivity required of the transparent electrode of a transparent device.

Test Example 6: Stacking Analysis of Graphene Layers

Isotope Test

In order to analyze the graphene growth mechanism and the stacking structure of graphene, isotope testing was performed. For graphene synthesis, 50 sccm $^{12}CH_4$ for 5 min, isotope 50 sccm $^{13}CH_4$ for 5 min, and 50 sccm $^{12}CH_4$ for 5 min were alternately supplied, thereby obtaining multilayer graphene using a Cu—Ni thin film laminate having a 200 nm-thick nickel thin film. $Cs^+$ ion sputtering was performed for 30 sec and 120 sec, after which TOF-SIMS was measured.

Based on the results of isotope testing, with reference to FIG. 5A, $^{12}C$ was high in top-layer graphene and $^{13}C$ was increased after $Cs^+$ ion sputtering.

Thus, the first supplied $^{12}CH_4$ participated in the formation of top-layer graphene, and adlayer graphene was grown between the top layer and the surface of the copper thin film by means of the subsequently supplied $^{13}CH_4$.

Since the position of the Raman peak varies depending on the isotope, isotope carbon for graphene in each region was identified through a Raman map ($G_{12}$, $G_{13}$ map) showing the G-peak of graphene.

As shown in FIG. 5B, graphene was found to grow through the surface-mediated reaction on the copper surface, rather than the precipitation of carbon atoms dissolved in the metal catalyst, through $G_{12}$ and $G_{13}$-map, which are not miscible. As shown in the cross-section of the Raman map, $^{12}C$ graphene was present in the entire area, and the region of $^{13}C$ graphene was partially overlapped therewith. Based on Raman spectra of A and B positions in the G-map, a 2D peak in the region where graphene grown from $^{12}C$ and $^{13}C$ was stacked was not divided but appeared widely (2D FWHM~100 $cm^{-1}$), which means that the graphene was Bernal-stacked.

With reference to FIG. 5C, the growth of graphene using the Cu—Ni thin film laminate is progressed in a manner in which graphene is grown by the first supplied $^{12}CH_4$ and adlayer graphene is then grown between the first grown graphene and the Cu—Ni thin film laminate by means of the subsequently supplied $^{13}CH_4$. The growth mechanism depends on the surface-mediated reaction (or diffusion and edge-attachment) in which the carbon atoms are attached to the graphene nuclei through diffusion on the copper surface to grow graphene. Thereby, the synthesized multilayer graphene is configured such that Bernal stacking is formed between the layers. The synthesis of graphene using the Cu—Ni thin film laminate results in graphene having high uniformity and low defect density over a large area, as confirmed above, rather than the growth of graphene due to the precipitation of dissolved carbon atoms.

Test Example 7: Dynamics of Ni

The nickel thin film of Example 1 shows diffusion behavior in bulk copper as well as surface sublimation at a high temperature for graphene synthesis, and has the concentration distribution shown in FIG. 6A. Since the amount of nickel is decreased through sublimation at a high temperature, the amount of nickel in the Cu—Ni thin film laminate is reduced over time.

As shown in FIG. 6B, the concentration of nickel remaining in the Cu—Ni thin film laminate becomes higher and lasts a longer time with an increase in the thickness of deposited nickel. However, the concentration of nickel is remarkably decreased over time. Here, the maximum thickness of synthesized graphene is determined by the thickness of nickel. This is because a high nickel concentration lasts a longer time with an increase in the thickness of nickel, which is a known nickel behavior, whereby the supply of carbon atoms required in order to synthesize graphene lasts a longer time. Furthermore, the nickel concentration decreases with increasing synthesis time, and thus, self-limiting properties, in which the thickness of graphene is not increased any further after a predetermined period of time, are exhibited.

The scope of the invention is represented by the claims below rather than the aforementioned detailed description, and all of the changes or modified forms that are derived from the meaning, range, and equivalent concepts of the appended claims should be construed as being included in the scope of the present invention.

What is claimed is:

1. A method of synthesizing graphene, comprising:
   (a) placing a Cu—Ni thin film laminate including a copper thin film comprising a top surface and a bottom surface and a nickel thin film comprising a top surface and a bottom surface formed on the bottom surface of the copper thin film in a chemical vapor depositor; and
   (b) bringing a graphene precursor into contact with the Cu—Ni thin film laminate such that the top surface of the copper thin film and the bottom surface of the nickel thin film are exposed to the graphene precursor, and performing chemical vapor deposition (CVD), thus synthesizing Bernal-stacked multilayer graphene on the top surface of the copper thin film,
   wherein during the synthesizing step of graphene, a nickel concentration gradient in the copper thin film is generated and a nickel concentration at the bottom surface of the copper thin film is higher than a nickel concentration at the top surface of the copper thin film as a part of nickel of the nickel thin film of the laminate is diffused to interior of the copper thin film,
   carbon atoms generated by a decomposition of the graphene precursor are subjected to surface-mediated reaction to form top-layer graphene of the Bernal-stacked multilayer graphene on the top surface of the copper thin film,
   the carbon atoms are absorbed to the bottom surface of the nickel thin film and a carbon concentration gradient is formed in the thickness direction of the Cu—Ni thin film laminate,
   the carbon atoms absorbed to the bottom surface of the nickel thin film are diffused by the carbon concentration gradient to the copper thin film along the thickness direction of the copper thin film such that the diffused carbon atoms reach the top surface of the copper thin film and form adlayer graphene through surface-mediated reaction between the top-layer graphene and the top surface of the copper thin film,
   the chemical vapor deposition is performed at a temperature of 600 to 1,300° C., and
   a thickness or a number of layers of the graphene synthesized on the top surface of the copper thin film is controlled by adjusting a thickness of the nickel thin film of the laminate.

2. The method of claim 1, wherein the nickel thin film has a thickness ranging from 5 to 1,000 nm.

3. The method of claim 1, wherein a number of layers of the graphene is any one ranging from 2 to 10.

4. The method of claim 1, wherein a thickness of the nickel thin film is adjusted to a range of 1000 nm or less but exceeding 70 nm in step (a), whereby multilayer graphene is synthesized in step (b).

5. The method of claim 1, wherein the graphene precursor is a hydrocarbon compound.

6. The method of claim 5, wherein the hydrocarbon compound is at least one selected from the group consisting of methane, ethane, propane, butane, ethylene, propylene, butylene, benzene, and ethanol.

7. The method of claim 1, wherein the chemical vapor deposition is performed by supplying the graphene precursor at a rate of 0.1 to 500 sccm.

8. The method of claim 1, wherein the chemical vapor deposition is performed for 10 to 500 min.

9. The method of claim 1, wherein the chemical vapor deposition is performed using any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

10. The method of claim 1, wherein the nickel thin film in step (a) is a nickel thin film having a pattern.

11. The method of claim 10, wherein the pattern includes at least one shape selected from the group consisting of a circular shape, an oval shape, a polygonal shape, a wave shape, a zigzag shape, and a convexo-concave shape.

* * * * *